(12) United States Patent
Yamada

(10) Patent No.: US 7,233,200 B2
(45) Date of Patent: Jun. 19, 2007

(54) AGC CIRCUIT, AGC CIRCUIT GAIN CONTROL METHOD, AND PROGRAM FOR THE AGC CIRCUIT GAIN CONTROL METHOD

(75) Inventor: Eiichi Yamada, Tokyo (JP)

(73) Assignee: Sony Corporation, Tokyo (JP)

( * ) Notice: Subject to any disclaimer, the term of this patent is extended or adjusted under 35 U.S.C. 154(b) by 130 days.

(21) Appl. No.: 11/057,232

(22) Filed: Feb. 15, 2005

(65) Prior Publication Data

US 2005/0190087 A1   Sep. 1, 2005

(30) Foreign Application Priority Data

Feb. 27, 2004   (JP)   ............................ P2004-052729

(51) Int. Cl.
*H03G 3/20*   (2006.01)
(52) U.S. Cl. ...................................... 330/141; 330/281
(58) Field of Classification Search ................ 330/136, 330/141, 281; 381/107; 455/244.1
See application file for complete search history.

(56) References Cited

U.S. PATENT DOCUMENTS 5,255,325 A * 10/1993  Ishimitsu et al. ........... 381/107

6,731,768 B1 * 5/2004  Delage ........................ 381/312

FOREIGN PATENT DOCUMENTS

| JP | 2-192209 | 7/1990 |
| JP | 4-113710 | 4/1992 |
| JP | 5-189007 | 7/1993 |
| JP | 10-163775 | 6/1998 |
| JP | 2000-151442 | 5/2000 |

* cited by examiner

*Primary Examiner*—Steven J. Mottola
(74) *Attorney, Agent, or Firm*—Oblon, Spivak, McClelland, Maier & Neustadt, P.C.

(57) ABSTRACT

The present invention relates to an AGC circuit, a AGC circuit gain control method, and a program for the AGC circuit gain control method, and may be applied to IC recorders, for example, as a portable recording/reproducing device, in order to ameliorate problems of listening to talk, music and the like during playback from IC recorders. In the invention, a signal level L1cyc is detected in units of the period of an input signal, and a recovery time constant r is switched on the basis of a decision as to the signal level L1cyc based on an average shift Lavg of the signal level L1cyc.

5 Claims, 13 Drawing Sheets

FIG. 3
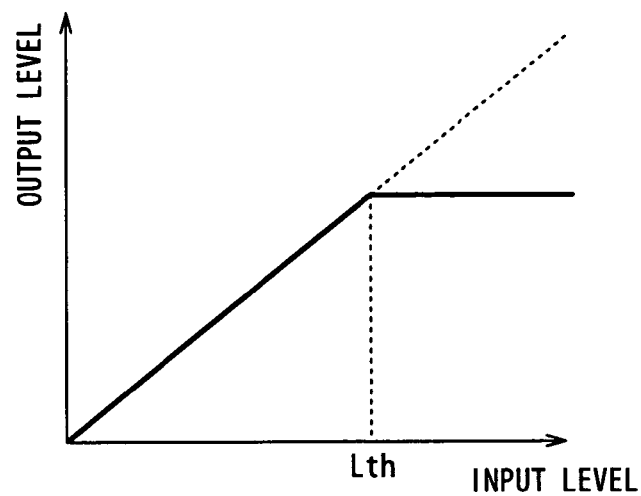
FIG. 4A
FIG. 4B
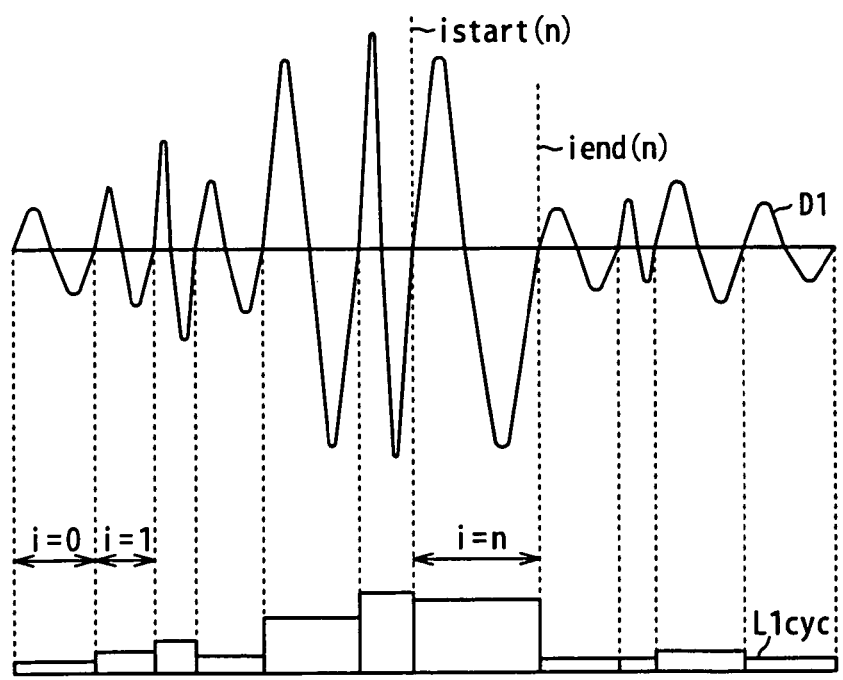

F I G. 12
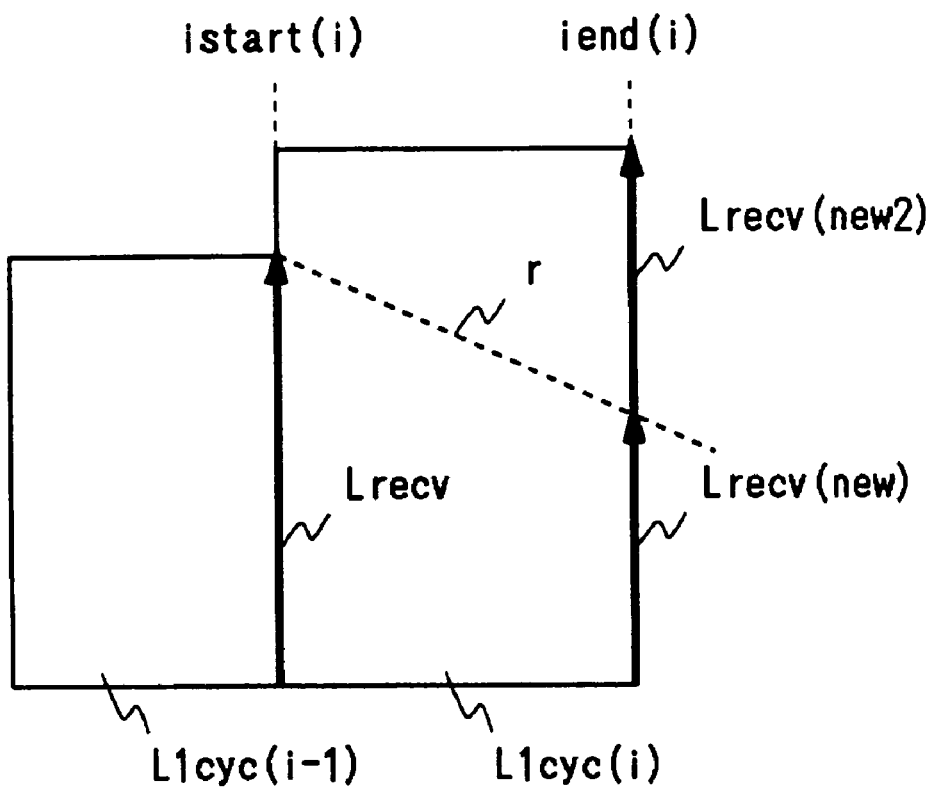
F I G. 13
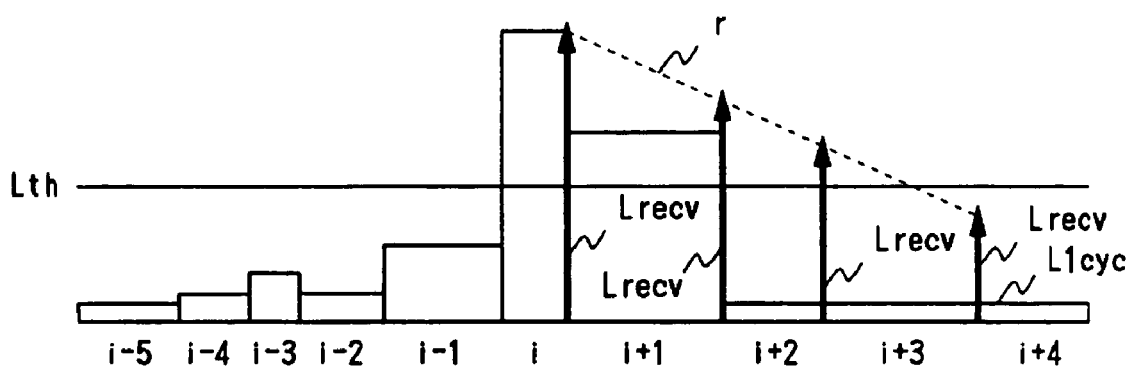

AGC CIRCUIT, AGC CIRCUIT GAIN CONTROL METHOD, AND PROGRAM FOR THE AGC CIRCUIT GAIN CONTROL METHOD

CROSS REFERENCE TO RELATED APPLICATIONS

The present document is based on Japanese Priority Document JP2004-052729, filed to the Japanese Patent Office on Feb. 27, 2004, the contents of which being incorporated herein by reference.

BACKGROUND OF THE INVENTION

1. Field of the Invention

The present invention relates to an AGC circuit, an AGC circuit gain control method, and a program for the AGC circuit gain control method, and can be applied to an IC recorder which operates as a portable recording/reproducing device, for example. The present invention is constructed to detect the level of an input signal in units of the period of the input signal, and switch recovery time constants on the basis of a decision as to the signal level detection result based on the average shift of the input signal level, thereby ameliorating problems of listening to talk, music and the like.

2. Description of Related Art

Various kinds of recording devices have heretofore been constructed to correct the signal level of an audio signal by an AGC (Automatic Gain Control) circuit. Specifically, when, for example, a talk is recorded by a recording device having an AGC circuit, the voice of a person at a near location is recorded at a large signal level, whereas the voice of a person at a remote location is recorded at a small signal level. If the recorded signal is reproduced at a sound volume appropriate for the voice of the person at the near location with neither of these signal levels corrected, the voice of the person at the remote location is reproduced at a low sound volume and becomes impossible to listen to. Conversely, if the recorded signal is reproduced at a sound volume appropriate for the voice of the person at the remote location, the voice of the person at a near location is reproduced at an excessive high sound volume, so that the voice of the person at the near location becomes impossible to listen to. For this reason, in this case, the AGC circuit corrects the respective voices of the persons at the remote and close locations into approximately equal signal levels by correcting the signal level of an audio signal according to the signal level of the audio signal.

FIG. 18 is a block diagram showing an IC recorder which constitutes one of these kinds of recording devices. In an IC recorder 1, a microphone 2 acquires, during recording, various sounds of a recording target and outputs an audio signal S1, and an amplification circuit 3, during recording, amplifies the audio signal S1 outputted from the microphone 2 by a predetermined gain and outputs the amplified audio signal S1. An analog-to-digital and digital-to-analog conversion circuit (ADDA) 4, during recording, performs digital/analog conversion of the audio signal S1 outputted from the amplification circuit 3 and outputs the resultant audio data D1 to a digital signal processor (DSP) 5. During reproduction (playback), the analog-to-digital and digital-to-analog conversion circuit 4 performs analog/digital conversion of the audio data D1 outputted from the digital signal processor 5, and outputs the resultant audio signal S1 to the second forward/reverse mechanism 6. The second forward/reverse mechanism 6, during reproduction, amplifies the audio signal S1 outputted from the analog-to-digital and digital-to-analog conversion circuit 4 by a predetermined gain, and drives a speaker 7 by this audio signal S1.

The digital signal processor 5, during recording, performs data compression on the audio data D1 outputted from the analog-to-digital and digital-to-analog conversion circuit 4 and generates encoded data D2, and outputs this encoded data D2 to a central processing unit (CPU) 8. During reproduction, the digital signal processor 5 performs data expansion on the encoded data D2 outputted from the central processing unit 8 and decodes the audio data D1, and outputs the resultant audio data D1 to the analog-to-digital and digital-to-analog conversion circuit 4. A memory 9 is made of, for example, a flash memory and, during recording, records and holds the encoded data D2 outputted from the digital signal processor 5, under the control of the central processing unit 8. During reproduction, the memory 9 outputs the held encoded data D2 to the digital signal processor 5 via the central processing unit 8 under the control of the central processing unit 8. The central processing unit 8 is a control circuit which controls the operation of this IC recorder 1. The central processing unit 8, in response to the operation of an operation button 10, instructs each section to perform operation such as recording and reproduction.

In this manner, in the IC recorder 1, after the audio signal S1 acquired by the microphone 2 is amplified with the predetermined gain by the amplification circuit 3, the amplified audio signal S1 is converted into the audio data D1, and this audio data D1 is compressed and is recorded on the memory 9. During reproduction, in the IC recorder 1, after audio data decoded from the encoded data D2 recorded on the memory 9 is expanded by the digital signal processor 5, the audio data is converted into the audio signal S1, and the speaker 7 is driven by the audio signal S1 so as to output reproduced sound.

In this IC recorder 1, an AGC circuit is formed by the digital signal processor 5 so that the signal level of the audio data D1 is corrected by the digital signal processor 15 during reproduction in the above-mentioned audio signal processing sequence.

FIG. 19 is a block diagram showing the construction of the digital signal processor 5 which is performing reproduction. In the digital signal processor 5, a decoder 12 receives the encoded data D2 held in the connecting cord 9 from the central processing unit 8 via a buffer memory 13 made of a random access memory, and performs data expansion on the encoded data D2 and outputs the audio data D1. A variable gain amplification circuit 14 receives the audio data D1 outputted from the decoder 12 via the buffer memory 15, and amplifies the audio data D1 by a predetermined gain specified by a gain control circuit 16 and outputs the resultant audio data D1. A buffer memory 17 stores the audio data D1 outputted from the variable gain amplification circuit 14 and outputs the audio data D1 to the analog-to-digital and digital-to-analog conversion circuit 4.

A level detection circuit 18 detects the signal level of the audio data D1 outputted from the gain control circuit 16, and on the basis of the signal level detection result by the level detection circuit 18, the gain control circuit 16 sets the gain of the variable gain amplification circuit 14 so that the signal level of the audio data D1 detected by the level detection circuit 18 becomes a predetermined level. The digital signal processor 5 processes the sequentially inputted audio data D1 and encoded data D2 by executing a predetermined processing program, and is constructed to have various functional blocks associated with the processing of the audio data and the encoded data, thereby correcting the signal level of the audio signal S1 and realizing the function of the AGC circuit.

The AGC circuit is constructed to correct and output the signal level of the audio data D1 in accordance with the input-output characteristic shown in FIG. 20 by way of example. Namely, if the amplitude value of the audio data D1 is within a range of not higher than a predetermined threshold Lth, the AGC circuit outputs the inputted audio data D1 without suppressing the signal level of the audio data D1, whereas if the amplitude value of the audio data D1 exceeds the threshold Lth, the AGC circuit decreases gain and suppresses the signal level of the audio data D1.

This AGC circuit is constructed to restore the gain suppressed by a so-called recovery time constant into the original gain so as to prevent waveform distortion and the like. However, there is a case where the AGC circuit produces an audio signal hard of listening to, because of the recovery time constant.

As specifically shown in FIGS. 21A to 21C, if the signal level of an input signal in, which has, for example, a constant signal level below the threshold Lth as a whole, rises as a pulse and exceeds the threshold Lth (FIG. 21A), the AGC circuit decreases gain in response to the pulse of the signal level and gradually restores the decreased gain into the original gain by a recovery time constant tR (FIGS. 21B and 21C). Accordingly, the signal level of an output signal out sharply lowers with the pulse rise of the signal level and is gradually restored to the original signal level according to the recovery time constant tR, so that if the recovery time constant tR is relatively long, a long time will be required until the decreased signal level is restored into the original signal level.

Accordingly, as shown in FIGS. 22A and 22B, if a talk is recorded at a constant sound volume during clapping (as shown by symbol "CLAP" in FIGS. 22A and 22B), the voice is intermittently suppressed by the rises of the input signal in, and if the recovery time constant tR is long, the duration of this suppression becomes long and breaks in sound occur, so that the voice becomes extremely hard to listen to (FIGS. 22A and 22B). Conversely, if the recovery time constant tR is short, breaks in sound can be prevented as shown in FIGS. 23A and 23B. However, if the recovery time constant tR is relatively short, the signal level of a long resonant sound sharply varies, so that, for example, when music is being reproduced, it is perceived as if wow-flatter occurred in the bass part of the music, and crisp-sounding noise is perceived in the treble part of the music.

For this reason, the AGC circuit is constructed so that when voice is to be recorded during ordinary conversation, the recovery time constant is set to approximately 10 msec, and when music is to be recorded, the recovery time constant is set to approximately several seconds.

The construction of an AGC circuit capable of switching its recovery time constant is disclosed in Japanese Laid-Open Patent JP-A-2000-151442 and the like.

However, even in the case where the recovery time constant is switched between talk and music in the above-mentioned manner, the problem of difficulty to listen to still remains. Namely, during the recording of voice, if the recovery time constant is set short, the recorded talk becomes easy to listen, but its sound volume instantaneously decreases after clapping or the like owing to the recovery time constant, with the result that the recorded talk still remains hard to listen. During the recording of music, if the recovery time constant is set long, the recorded music becomes easy to listen, but its sound volume sharply decreases after clapping or the like and is gradually restored to the original sound volume, with the result that the recorded music still remains hard to listen.

SUMMARY OF THE INVENTION

The present invention has been conceived in view of the above-mentioned problem, and provides an AGC circuit capable of ameliorating problems of listening to talk, music and the like, an AGC circuit gain control method, and a program for the AGC circuit gain control method.

To alleviate the above-mentioned problems, according to a preferred embodiment of the present invention, there is provided an AGC circuit which varies gain according to a signal level of an input signal and corrects the signal level of the input signal. The AGC circuit includes signal level detection means for detecting the signal level of the input signal in units of the period of the input signal and outputting a signal level detection result, and gain varying means for providing variable control of gain for each period corresponding to the signal level detection result on the basis of the signal level detection result. The gain varying means, gradually restores the decreased gain into gain corresponding to the signal level detection result by a recovery time constant in response to the fall of the signal level of the input signal, after decreasing the gain in response to the rise of the signal level of the input signal, and switches the recovery time constant on the basis of a decision as to the signal level detection result based on a average shift of the signal level of the input signal.

According to another preferred embodiment of the present invention, there is provided a gain control method for an AGC circuit which varies gain according to a signal level of an input signal and corrects the signal level of the input signal. The gain control method includes a signal level detection step of detecting the signal level of the input signal in units of the period of the input signal and outputting a signal level detection result, and a gain varying step of providing variable control of gain for each period corresponding to the signal level detection result on the basis of the signal level detection result. The gain varying step gradually restores the decreased gain into gain corresponding to the signal level detection result by a recovery time constant in response to the fall of the signal level of the input signal, after decreasing the gain in response to the rise of the signal level of the input signal, and switches the recovery time constant on the basis of a decision as to the signal level detection result based on a average shift of the signal level of the input signal.

According to another preferred embodiment of the present invention, there is provided a program of a gain control method for an AGC circuit which varies gain according to a signal level of an input signal and corrects the signal level of the input signal, by causing arithmetic processing means to execute a predetermined processing sequence. The processing sequence includes a signal level detection step of detecting the signal level of the input signal in units of the period of the input signal and outputting a signal level detection result, and a gain varying step of providing variable control of gain for each period corresponding to the signal level detection result on the basis of the signal level detection result. The gain varying step may gradually restore the decreased gain into gain corresponding to the signal level detection result on the basis of a recovery time constant in response to the fall of the signal level of the input signal, after decreasing the gain in response to the rise of the signal level of the input signal, and switch the recovery time constant on the basis of a decision as to the signal level detection result based on an average shift of the signal level of the input signal.

In the AGC circuit according the preferred embodiment of the present invention, the average shift value is an approximate value calculated by weighting addition based on a previously calculated average shift value and the result of signal level detection.

A preferred embodiment of the present invention may be provided with the AGC circuit for varying gain according to the signal level of the input signal and correcting the signal level of the input signal. The AGC circuit may include the signal level detection means for detecting the signal level of the input signal in units of the period of the input signal and outputting the signal level detection result, and the gain varying means for providing variable control of gain for each period corresponding to the signal level detection result on the basis of the signal level detection result. The gain varying means may gradually restore the decreased gain into gain corresponding to the signal level detection result by a recovery time constant in response to the fall of the signal level of the input signal, after decreasing the gain in response to the rise of the signal level of the input signal, and switch the recovery time constant on the basis of the decision as to the signal level detection result based on the average shift of the signal level of the input signal. Accordingly, if the signal level rises almost instantaneously, for example, the recovery time constant can be set short so as to follow the fall of the signal level after the rise of the signal level, and if the signal level rises as a whole, the recovery time constant can be set long, whereby it is possible to switch the recovery time constant according to the transition of the signal level of the input signal. Accordingly, it is possible to ameliorate problems of listening to talk, music or the like, by preventing the signal level from being unnecessarily suppressed by the recovery time constant and by suppressing the signal level by the recovery time constant as occasion demands.

According to the preferred embodiments of the present invention, an AGC circuit may be provided, capable of ameliorating problems of listening to talk, music and the like, an AGC circuit gain control method, and a program for the AGC circuit gain control method.

According to the preferred embodiments of present invention, it is possible to ameliorate problems of listening to talk, music and the like. The present invention can be applied to, for example, IC recorders.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIG. 3 is a characteristic curve diagram showing the input-output characteristic of an AGC circuit in the processing of FIG. 1;

FIGS. 4A and 4B are time charts aiding in describing the processing of FIG. 1;

FIG. 12 is a time chart aiding in describing the updating of the variable Lrecv;

FIG. 13 is a time chart showing the case where the fall of the signal level is large;

DESCRIPTION OF THE PREFERRED EMBODIMENTS

Preferred embodiments of the present invention will be described below in detail with reference to the accompanying drawings.

Figure 2:
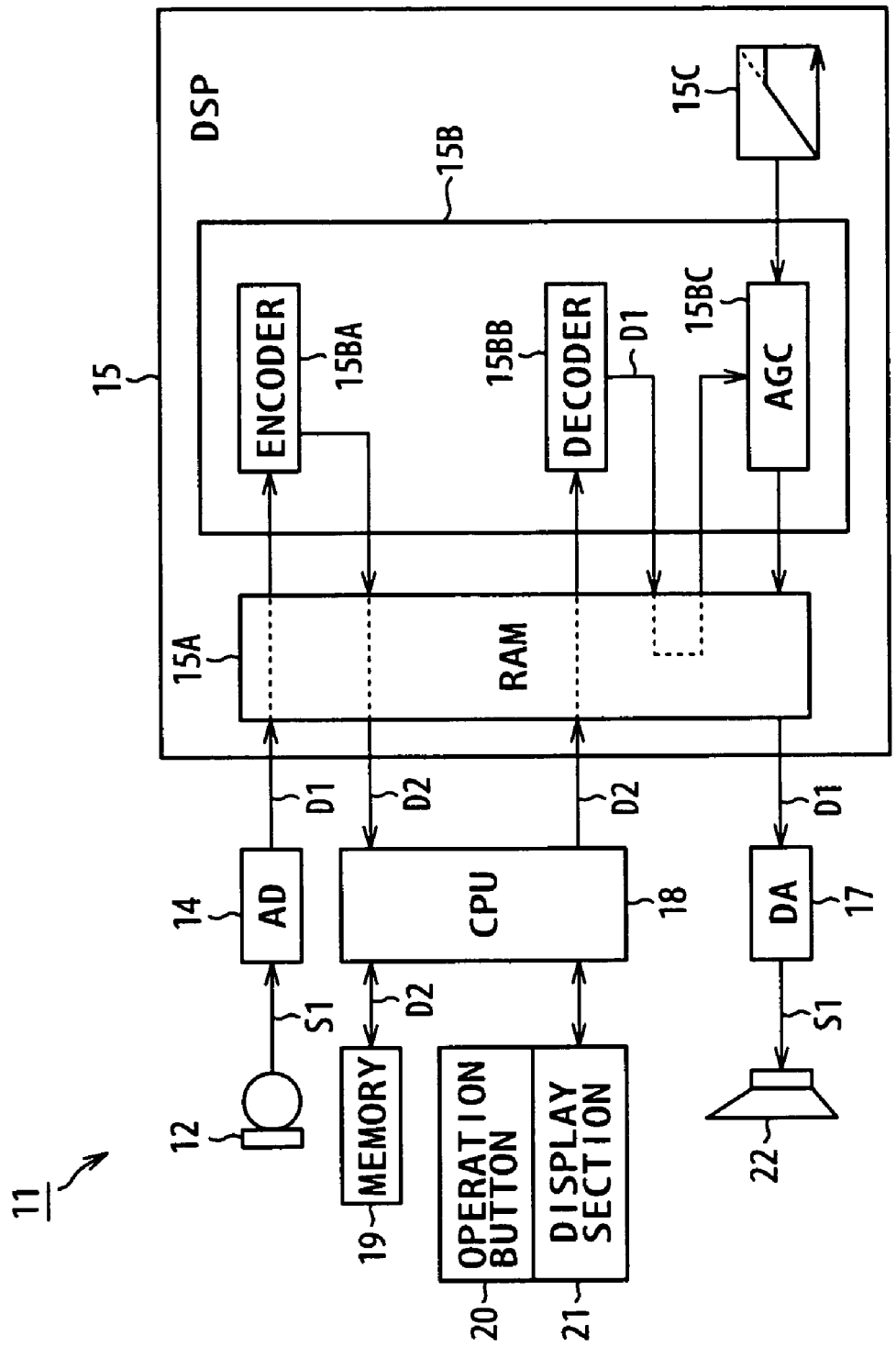
FIG. 2 is a block diagram showing the IC recorder according to the preferred embodiment of the present invention.

FIRST EXAMPLE OF THE PREFERRED EMBODIMENT (1) Construction of the First Example of Preferred Embodiment FIG. 2 is a block diagram showing an IC recorder according to a first preferred embodiment of the present invention. In an IC recorder 11, a microphone 12, during recording, acquires various sounds of a recording target and outputs an audio signal S1, and an analog digital conversion circuit (AD) 14, during recording, performs digital/analog conversion of the audio signal S1 and outputs resultant audio data D1 to a digital signal processor (DSP) 15.

The digital signal processor 15, during recording, performs data compression on the audio data D1 outputted from the analog digital conversion circuit 14 and generates encoded data D2, and outputs this encoded data D2 to a central processing unit (CPU) 18. During reproduction, the digital signal processor 15 performs data expansion on the encoded data D2 outputted from the central processing unit 18 and decodes the audio data D1, and corrects the signal level of this audio data D1 and outputs the resultant audio data D1 to a digital/analog conversion circuit (DA) 17. A memory 19 is made of, for example, a memory card using a flash memory and, during recording, records and holds the encoded data D2 outputted from the digital signal processor 15, under the control of the central processing unit 18. During reproduction, the memory 19 outputs the held encoded data D2 to the digital signal processor 15 via the central processing unit 18 under the control of the central processing unit 18. The central processing unit 18 is a control circuit which controls the operation of this IC recorder 1. The central processing unit 18, in response to the operation of an operation button 20, instructs each section to perform operation such as recording and reproduction, and displays various operation menus via a display section 21 using a liquid crystal display panel.

The digital/analog conversion circuit 17, during reproduction, performs digital/analog conversion of the audio data D1 outputted from the digital signal processor 15, and drives a speaker 22 by means of the resultant audio signal S1.

In this manner, in the IC recorder 11, after the audio signal S1 acquired by the microphone 12 is converted into the audio data D1, this audio data D1 is compressed and is recorded on the memory 19. During reproduction, in the IC recorder 11, after the audio data D1 decoded from the encoded data D2 recorded on the memory 19 is expanded by the digital signal processor 15, the audio data D1 is converted into the audio signal S1, and the speaker 22 is driven by the audio signal so as to output reproduced sound.

In this IC recorder 11, an AGC circuit is formed by the digital signal processor 15 so that the signal level of the audio data D1 is corrected by the digital signal processor 15 during reproduction in the above-mentioned audio signal processing sequence.

Namely, the digital signal processor 15 includes a random access memory (RAM) 15A via which the digital signal processor 15 communicates the audio data D1 and the encoded data D2 with the analog digital conversion circuit 14, the central processing unit 18 and the digital/analog conversion circuit 17, and a digital signal processor core 15B which is arithmetic processing means and executes a predetermined processing program to process these audio data D1 and encoded data D2. The digital signal processor core 15B is constructed to have functional blocks which are an encoder BA for performing data compression on the audio data D1 and generating the encoded data D2, a decoder 15BB for performing data expansion on the encoded data D2 and decoding the audio data D1, and an AGC circuit 15BC for correcting the signal level of the audio data D1. The processing program is provided by prior installation, but may also be provided by downloading via a network or by a recording medium. Various recording media such as memory cards, magnetic discs and optical discs can be applied to the recording medium.

The digital signal processor 15 is constructed to correct, in processing associated with the AGC circuit 15BC, the signal level of the audio data D1 by using a gain coefficient of an AGC coefficient conversion table 15C provided in an internal random access memory built in the AGC circuit 15BC. The AGC coefficient conversion table 15C is constructed so that gain by which to correct the signal level of the audio data D1 is recorded on the AGC coefficient conversion table 15C in accordance with the input level of the AGC circuit 15BC. In the first preferred embodiment, this gain is defined by the input-output characteristic shown in FIG. 3. Namely, within the range of this input-output characteristic in which the input level is not lower than a predetermined threshold Lth, the output level is made to rise in proportion to the input level so that the gain based on this proportion is set to a gain of 1. Within the range in which the input level exceeds the threshold Lth, the gain is made gradually lower with an increase in the input level so that the output level is held at the threshold Lth.

Figure 1:
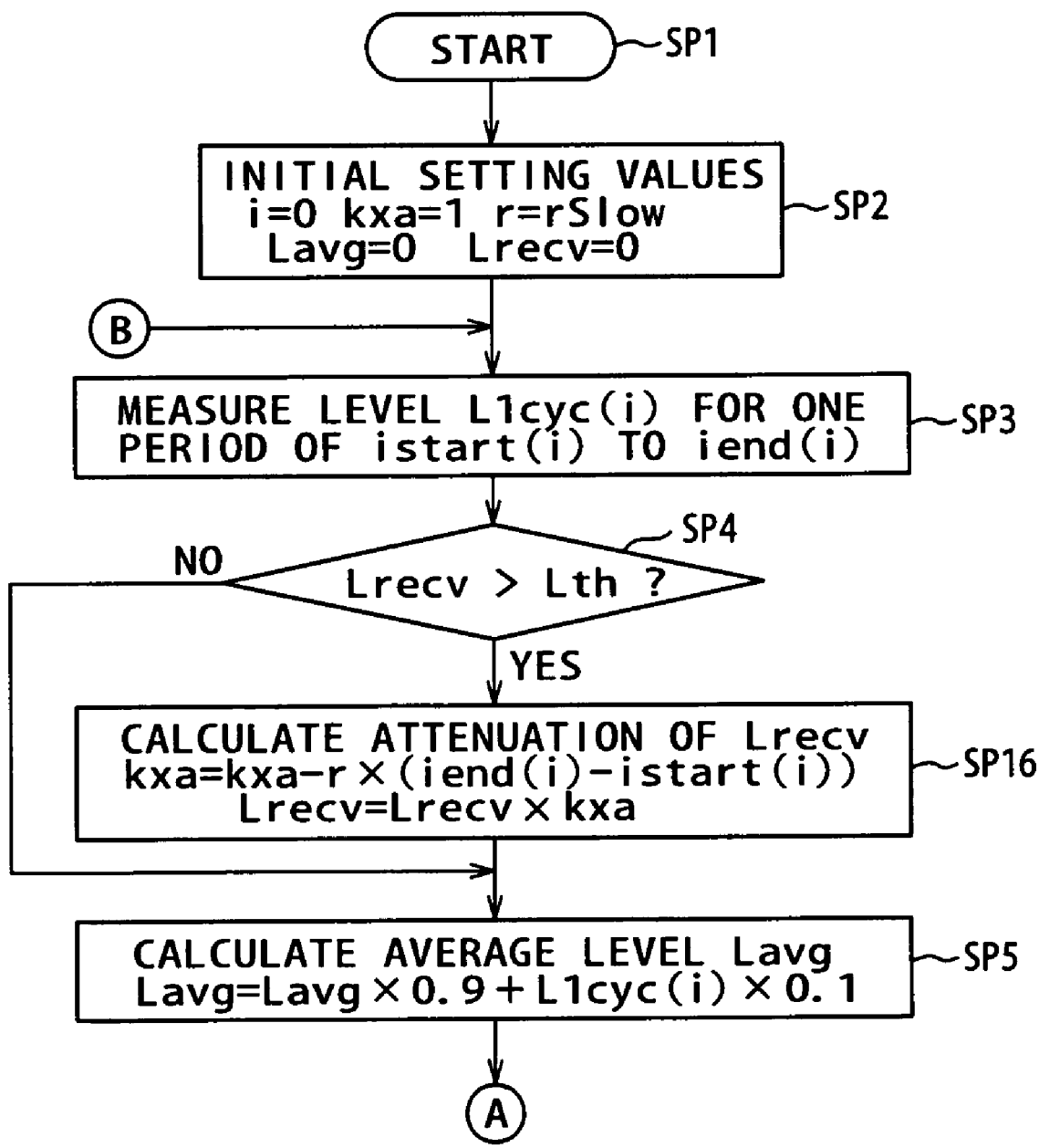
FIG. 1 is a flowchart showing a processing sequence of a digital signal processor in an IC recorder according to a preferred embodiment of the present invention.
Figure 5:
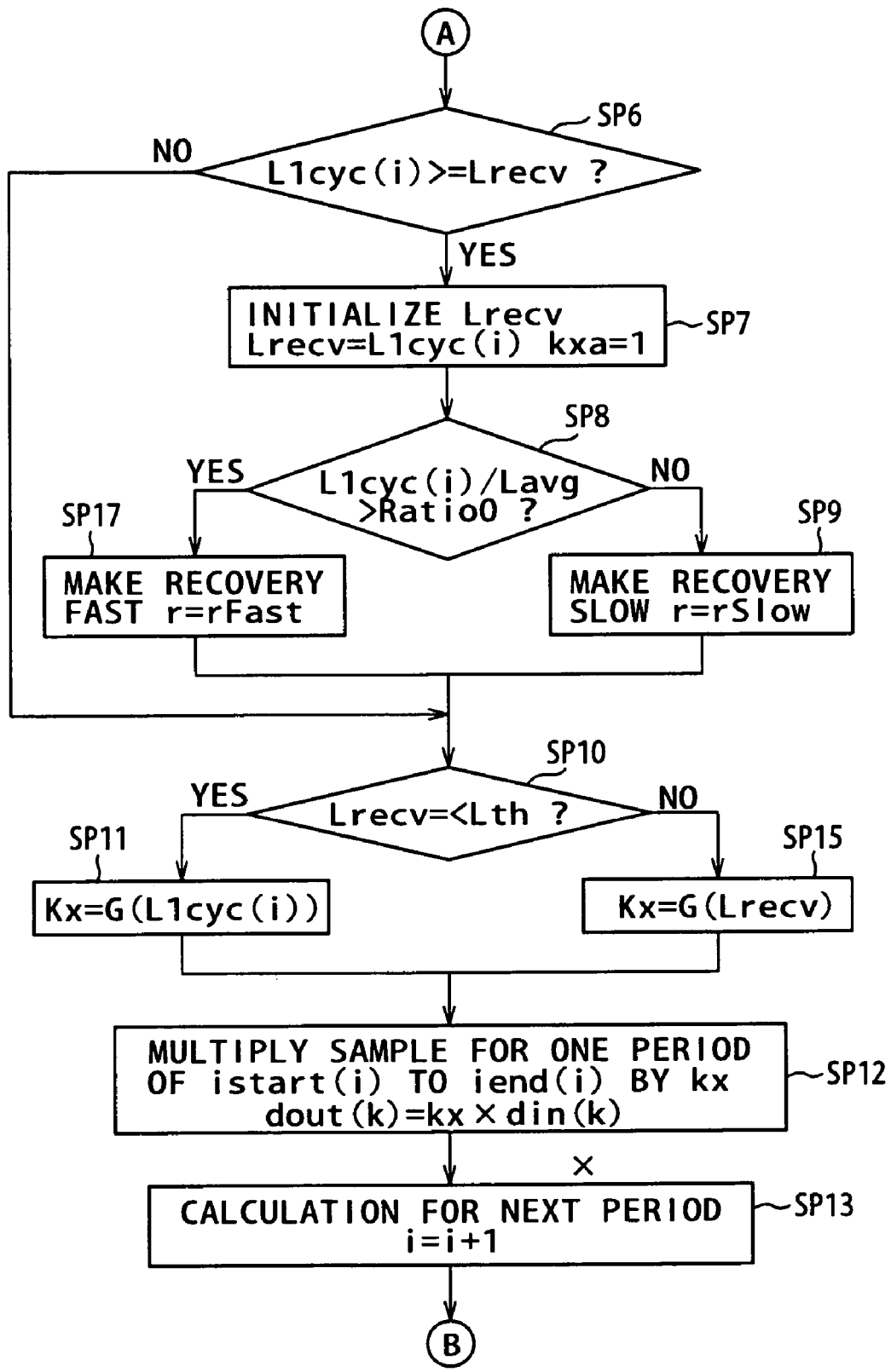
FIG. 5 is a flowchart showing a continuation of the process of FIG. 1.

FIGS. 1 and 5 are flowcharts showing the processing sequence of the AGC circuit 15BC of this digital signal processor 15. When a user operates the operation button 20 to instruct the IC recorder 11 to reproduce the encoded data D2 recorded on the memory 19, the digital signal processor 15, under the control of the central processing unit 18, starts a processing sequence associated with the decoder 15BB and the processing sequence shown in FIG. 1, and executes these processing sequences in a simultaneous and parallel manner.

Namely, when the digital signal processor 15 starts the processing sequence shown in FIG. 1, the digital signal processor 15 proceeds from step SP1 to step SP2 and initializes a set of variables to be used in this processing. As shown in FIGS. 4A and 4B, the digital signal processor 15 is constructed to set the period from which the signal waveform of the audio data D1 crosses zero (crosses 0) and rises until the signal waveform again crosses zero and rises, to one period of the audio data D1, and process the audio data D1 in units of this period. In the set of variables, a variable i is a variable which specifies the period of audio data associated with a target to be processed, from the starting time of the processing. In the initializing processing of step SP2, the variable 1 is set to a value of 0.

A variable kxa is a multiplication value to be used for updating a variable Lrecv which will be described later. In step SP2, the variable kxa is initialized to a value of 1. A variable r is a variable which specifies a recovery time constant, and in the first preferred embodiment, two recovery time constants, i.e., a recovery time constant rFast indicative of short time and a recovery time constant rSlow indicative of long time, are prepared. In step SP2, the variable r is initialized to specify the recovery time constant rSLow indicative of short time. The recovery time constant rFast and the recovery time constant rSlow are respectively assigned several 10 msec and several msec.

Figure 6:
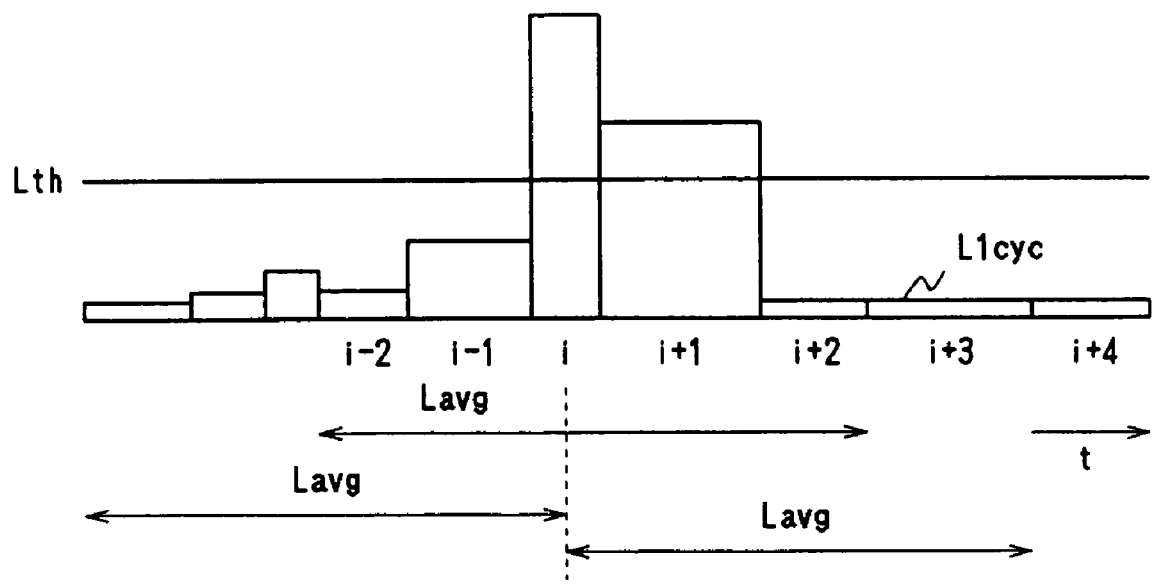
FIG. 6 is a time chart aiding in describing moving average according to the processing of FIG. 1.

A variable Lavg is a variable indicating the average value of the signal level of the audio data D1. As shown in FIG. 6, the digital signal processor 15 calculates the average shift Lavg of the signal level of the audio data D1 over a predetermined number of successive periods of the audio data D1 containing the period specified by the variable i, and determines the rise of a signal level L1cyc(i) over the period specified by the variable i, on the basis of the average shift Lavg, and switches the recovery time constant r. Through this initializing processing, the average shift Lavg is initialized to 0. In addition, the average shift Lavg may be calculated over a predetermined number of periods which include the central period, i.e., the period specified by the variable i, and the periods preceding and succeeding the central period, or the average shift Lavg may also be calculated over a predetermined number of periods which include the period specified by the variable i, as the start period or the end period. If the average shift Lavg is calculated over a predetermined number of periods whose end period is the period specified by the variable i, the periods do not include a period associated with the succeeding processing, so that the sampling number of the audio data D1 during reading-ahead can be eliminated to simplify the processing. Conversely, if the average shift Lavg is calculated over a predetermined number of periods whose start period is the period specified by the variable i, the sampling number of the audio data D1 during reading-ahead increases and the processing becomes complicated, but the variation of the signal level of the audio data D1 after that start period can be accurately predicted, whereby the control of gain in the AGC circuit 15BC can be executed far more appropriately. In addition, in the first preferred embodiment of the present invention, the processing is simplified by calculating the average shift Lavg over a predetermined number of periods whose end period is the period specified by the variable i.

Figures 7A, 7B:
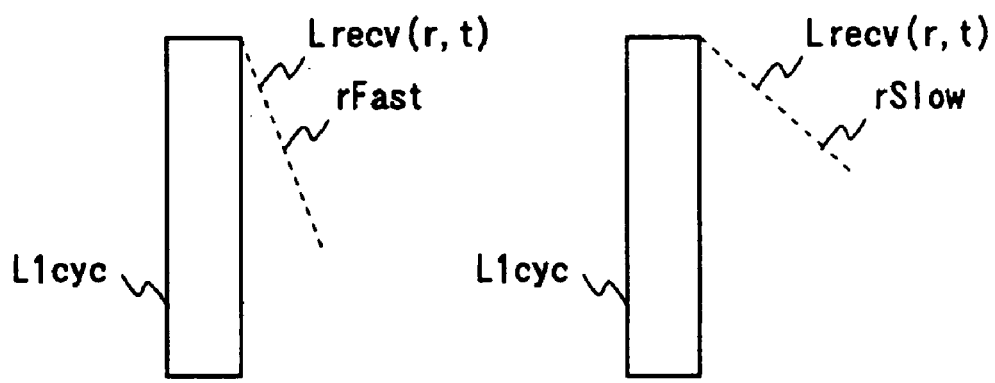
FIGS. 7A and 7B are schematic views aiding in describing recovery time constants.

The variable Lrecv is assigned a signal level determined by the recovery time constant r over one period specified by the variable i. More specifically, as shown in FIGS. 7A and 7B which respectively show the cases where the recovery time constant is short (rFast) and where the recovery time constant is long (rSlow), the initial value of the signal level due to this attenuation characteristic is assigned to the variable Lrecv on condition that the signal level L1cyc(i) for the period specified by the variable i exhibits an attenuation characteristic due to the recovery time constant r as shown in FIGS. 7A and 7B. In the first preferred embodiment, it is assumed that the signal level based on this attenuation characteristic linearly lowers, and the attenuation characteristic is represented by approximation using a linear function so that the processing is simplified by an amount corresponding to the approximation. The variable Lrecv is set to a value of 0 by this initializing processing.

After having initialized each of the variables in the above-mentioned manner, the digital signal processor 15 proceeds to step SP3 and detects the signal level L1cyc(i) of the audio data D1 over the period specified by the variable i (FIG. 4B). In the first preferred embodiment, a maximum amplitude value in the period specified by the variable i is assigned to the signal level L1cyc(i), whereby the arithmetic throughput can be reduced to simplify the processing. In other words, various reference values which vary according to a maximum amplitude value in one period of the audio data D1 can be applied to the signal level L1cyc(i) in this one period, and for example, the sum of the squares of individual sampled values over one period of the audio data D1, the sum of the absolute values of the individual sampled values, the average value of the individual sampled values, or the absolute value of a peak value can be applied to the signal level L1cyc(i). In addition, a variable istart(i) and a variable iend(i) respectively indicate the start time and the end time of the period specified by the variable i.

After having detected the signal level L1cyc(i) of the audio data D1 in the above-mentioned manner, the digital signal processor 15 proceeds to step SP4 and determines whether the signal level based on the variable Lrecv exceeds the threshold Lth. If the digital signal processor 15 obtains a negative result, the digital signal processor 15 proceeds to step SP5.

Here, the digital signal processor 15 calculates the average shift Lavg over the period specified by the variable i. The digital signal processor 15 is constructed to calculate the average shift Lavg of the signal level over a predetermined number of periods whose end period is the period specified by the variable i, and calculates the average shift Lavg by an approximate calculation using the weighted sum of the so far calculated average shift Lavg weighted by a weighting coefficient of 0.9 and the signal level L1cyc(i) calculated in step SP3 and weighted by a weighting coefficient of 0.1, thereby simplifying the processing by an amount corresponding to the approximate calculation. In other words, in this calculation of the average shift Lavg, various reference values which indicate the average signal level of the audio data D1 over a plurality of successive periods including the period specified by the variable i can be applied to the average shift Lavg, and for example, the sum of the squares of individual sampled values of the audio data D1 over these periods, the sum of the absolute values of the individual sampled values, the average value of the individual sampled values, or the absolute value of the amplitude values of the audio data D1 can be applied to the average shift Lavg.

Then, the digital signal processor 15 proceeds to step SP6 and determines whether the signal level L1cyc(i) of the audio data D1 over the period specified by the variable i calculated in step SP3 exceeds the signal level based on the variable Lrecv subjected to the processing of step SP4. In this case, since the initial value of the variable Lrecv is set to a value of 0, the digital signal processor 15 obtains an affirmative answer, and proceeds from step SP5 to step SP7 and again initializes the variable Lrecv by the recovery time constant r. This initializing processing of step SP7 is executed in such a manner that the signal level L1cyc(i) over the period specified by the variable i is set to the signal level based on the variable Lrecv as shown by a suffix "new" in FIG. 8. The digital signal processor 15 also sets the gain kx of the AGC circuit 15BC to a gain of 1.

In the next step SP8, the digital signal processor 15 divides the signal level L1cyc(i) calculated in step SP3 by the average shift Lavg calculated in step SP5 and makes a decision using a predetermined threshold Ratio0, thereby determining whether the signal level based on the period specified by the variable i is sharply raising. If the signal level of the audio data D1 remains at an approximately constant signal level, the digital signal processor 15 obtains a negative result in step SP8, and proceeds from step SP8 to step SP9. In step SP9, the digital signal processor 15 sets the recovery time constant r to the recovery time constant rSlow indicative of long time.

In the next step SP10, the digital signal processor 15 determines whether the signal level based on the variable Lrecv is not higher than the threshold Lth. If the digital signal processor 15 obtains an affirmative result, the digital signal processor 15 proceeds from step SP10 to step SP11 and accesses the AGC coefficient conversion table 15C on the basis of the signal level L1cyc(i) of the audio data D1 over the period specified by the variable i calculated in step SP3, and sets a gain G(L1cyc(i)) corresponding to this signal level L1cyc(i) to a gain kx.

In the next step SP12, the digital signal processor 15 corrects by this gain kx a signal level din(k) of the audio data D1 over one period specified by the variable i, and executes AGC processing of the audio data D1 over this one period. In the next step SP13, the digital signal processor 15 increments the variable i and switches the target to be processed to the succeeding one period. After that, the digital signal processor 15 returns to step SP3 and starts to process the succeeding one period.

Figure 8:
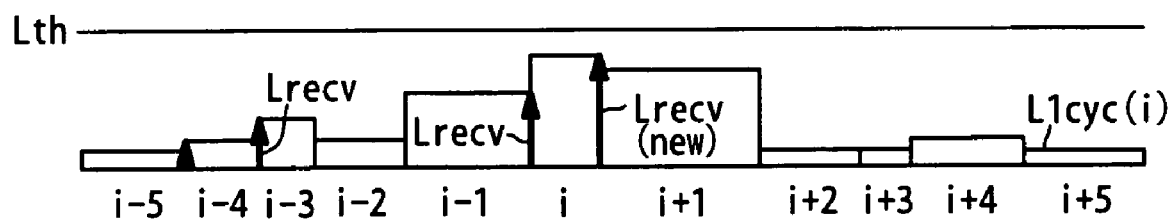
FIG. 8 is a time chart aiding in describing a variable Lrecv which is used in the processing sequence of FIG. 1.
Figure 9:
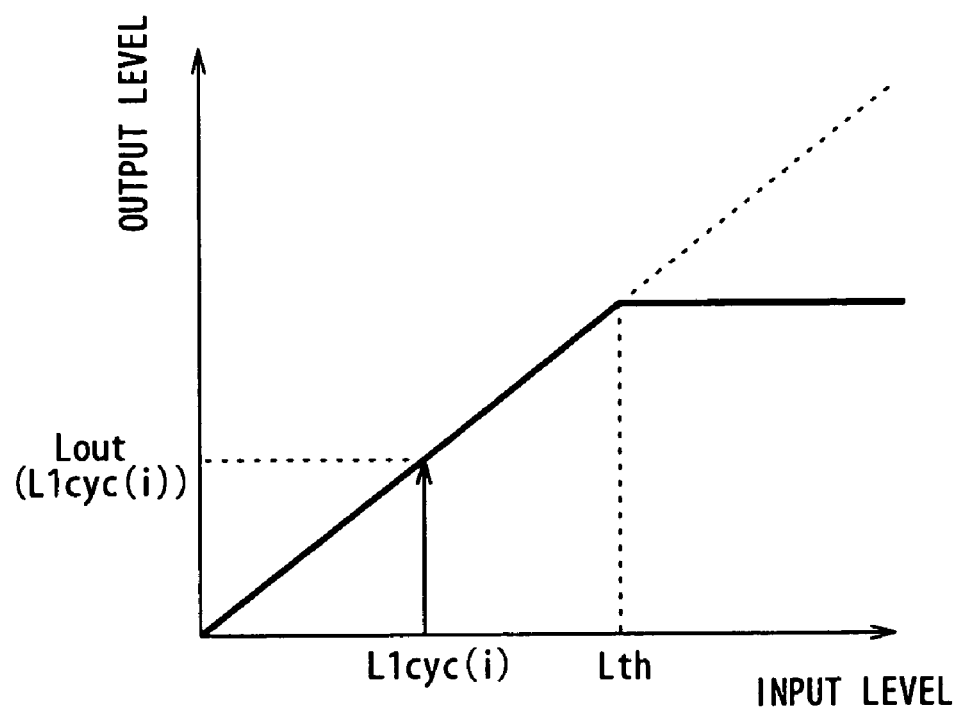
FIG. 9 is a characteristic curve diagram aiding in describing the setting of gain for a small signal level.

Accordingly, in the case where the signal level of the audio data D1 keeps monotonously increasing at not higher than the threshold Lth in each of successive periods like periods i−5 to i−3, i−2 to i and i+2 to i+4 in FIG. 8, the digital signal processor 15 repeats the processing sequence of steps SP3-SP4-SP5-SP6-SP7-SP8-SP9-SP10-SP11-SP12-SP13-SP3 for each of the successive periods, and sequentially multiplies each of the sampled values of the audio data D1 by a value of 1 while updating the variable Lrecv associated with the attenuation curve, thereby outputting the audio data D1 at an output level proportional to the input level, as shown in FIG. 9.

In addition, in the case where the signal level of the audio data D1 over each of the successive periods is not higher than the threshold Lth and the signal level over a period such as any of the periods i−2, i+1 and i+2 shown FIG. 8 falls compared to the immediately previous period, the digital signal processor 15 obtains a negative result in step SP6 in the processing sequence of steps SP3-SP4-SP5-SP6-SP7-SP8-SP9-SP10-SP11-SP12-SP13-SP3. Accordingly, the digital signal processor 15 proceeds from step SP6 directly to step SP10 without executing the updating processing of the variable Lrecv or making a decision as to the rise of the signal level over the period specified by the variable i.

Accordingly, in the case where the signal level L1cyc(i) is not higher than the threshold Lth and the signal level L1cyc(i) rises compares to the immediately previous period, the digital signal processor 15 outputs the audio data D1 at the input level by executing the processing sequence of steps SP3-SP4-SP5-SP6-SP7-SP8-SP9-SP10-SP11-SP12-SP13-SP3.

In this case as well, the digital signal processor 15 outputs the audio data D1 with an input-output characteristic having a proportional relationship to the input level as shown in FIG. 8.

Figure 10:
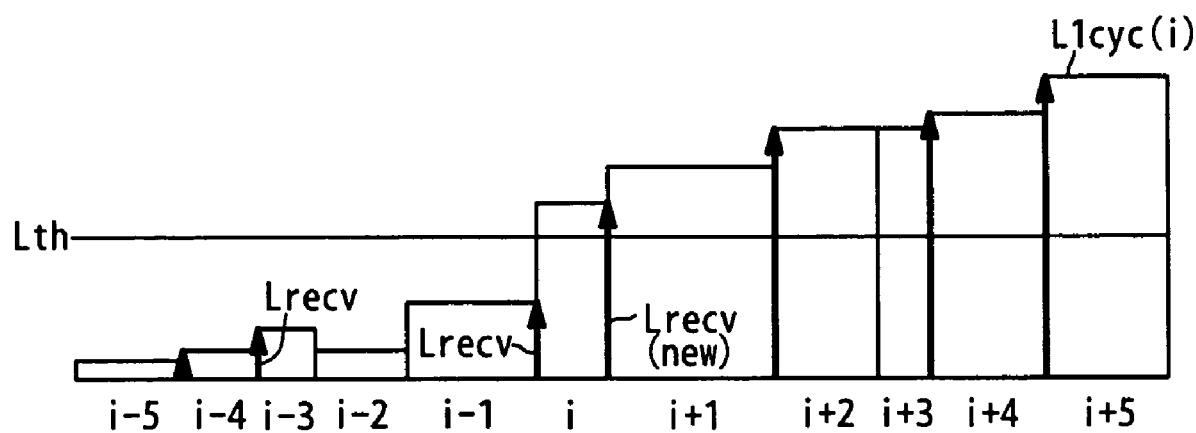
FIG. 10 is a time chart aiding in describing an example of a monotonously increasing signal level.

Conversely, while the digital signal processor 15 is repeating the processing of the audio data D1 having a signal level of not higher than the threshold Lth, if the digital signal processor 15 receives a period containing the signal level L1cyc(i) which exceeds the threshold Lth as shown in FIG. 10, the digital signal processor 15 sets the signal level L1cyc(i) exceeding the threshold Lth to the variable Lrecv in this repetitive processing of step SP7, and obtains a negative result in step SP10. In this case, the digital signal processor 15 proceeds from step SP10 to step SP15, and accesses the AGC coefficient conversion table 15C on the basis of the signal level L1cyc(i) over the period specified by the variable i, and sets a gain G(Lrecv) based on the signal level L1cyc(i) to the gain kx. Then, in the next step SP12, the digital signal processor 15 corrects the signal level of the audio data D1 over this period i by the gain kx, and then returns from step SP13 to step SP3.

Figure 11:
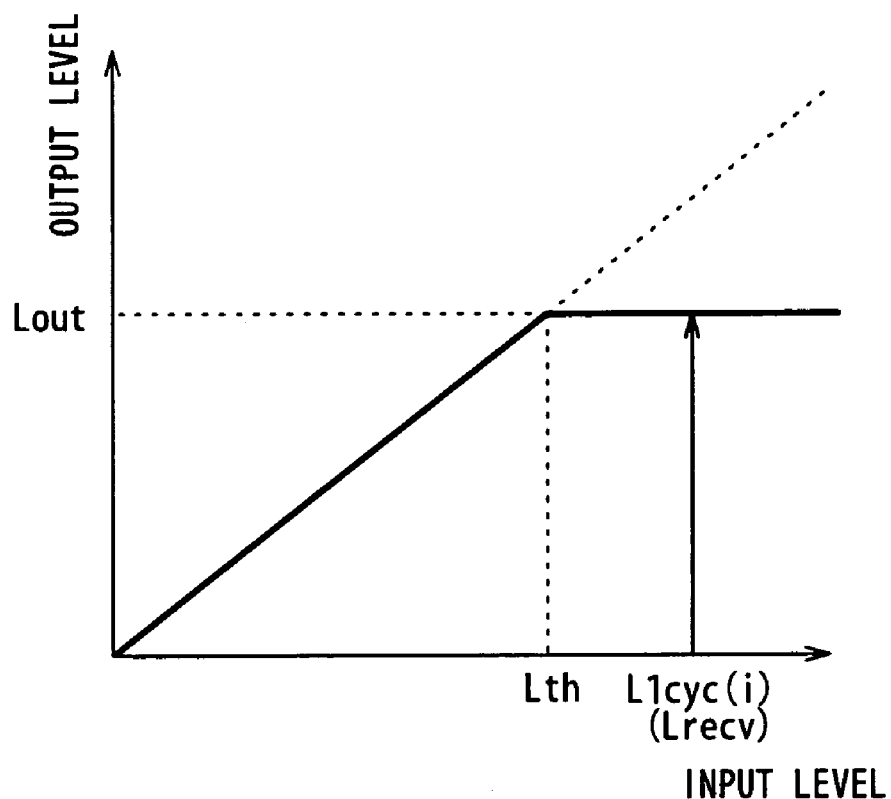
FIG. 11 is a characteristic curve diagram aiding in describing the setting of gain in the example of FIG. 10.

Accordingly, in this case, as shown in FIG. 11, the digital signal processor 15 corrects the signal level of the audio data D1 on the basis of the saturation range of the input-output characteristic, and outputs the result.

In the case where the signal level L1cyc(i) exceeding the threshold Lth is set to the variable Lrecv in the above-mentioned manner, the digital signal processor 15 returns to step SP3, and in the next step SP4, obtains an affirmative result because the signal level based on the variable Lrecv (over the period specified by the variable i+1) exceeds the threshold Lth. The digital signal processor 15 proceeds to step SP16.

In step SP16, the digital signal processor 15 updates the variable Lrecv by the attenuation characteristic specified by the recovery time constant r. In this case, the digital signal processor 15 assumes an attenuation characteristic of a signal level which linearly varies according to the inclination specified by the recovery time constant r, on the basis of the multiplication value kxa to be used for the updating of the variable Lrecv, and calculates the variable kxa at the end time iend(i) of the period specified by the variable i in accordance with the attenuation characteristic, which period is started on the basis of the variable kxa. The digital signal processor 15 also multiplies the variable Lrecv by the calculated multiplication value kxa, and calculates a signal level Lrecv(new) obtainable at the end time iend(i) of the period i over which the signal level based on the variable Lrecv is attenuated by the attenuation characteristic specified by the recovery time constant r as shown in FIG. 12.

The digital signal processor 15 updates the variable Lrecv in this manner, and proceeds to step SP5. The digital signal processor 15 calculates the average shift Lavg in step SP5, and proceeds to step SP6. In step SP6, if the signal level of the audio data D1 over the period i associated with the processing of updating the variable Lrecv is not lower than the signal level based on the updated variable Lrecv, the digital signal processor 15 proceeds from step SP6 to step SP7 and again updates the variable Lrecv updated in this manner (as shown by Lrecv(new2) in FIG. 12), and resets the variable kxa to the original value of 1. Then, the digital signal processor 15 proceeds to step SP8.

Accordingly, as shown in FIG. 10, over the periods of the variables i to i+5, the digital signal processor 15 suppresses the signal level of the audio data D1 to the signal at the threshold Lth and outputs the resultant audio data D1, while again updating in step SP7 the variable Lrecv updated in step SP16, by repeating the processing sequence of steps SP3-SP4-SP16-SP5-SP6-SP7-SP8-SP9-SP10-SP11-SP12-SP13-SP3.

In the case where, as shown in FIG. 13, the signal level L1cyc(i) increases above the threshold Lth and then falls and the signal level based on the variable Lrecv associated with the attenuation curve of the recovery time constant r is higher than the signal level L1cyc over each of the periods, the digital signal processor 15 obtains a negative result in step SP6, and proceeds to step SP10 without again updating in step SP7 the variable Lrecv updated in step SP16. In step SP10, the digital signal processor 15 sequentially updates the variable Lrecv on the basis of the signal level at the end time of each of the periods in accordance with the attenuation curve of the recovery time constant r. Then, in step SP15, the digital signal processor 15 selects the gain kx corresponding to the signal level based on the variable Lrecv from the AGC coefficient conversion table 15C, and corrects the gain of the audio data D1 by the gain kx.

Figure 14:
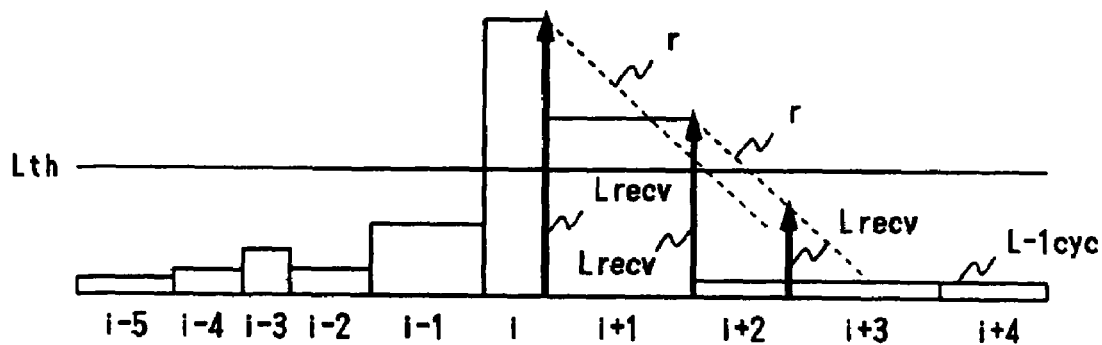
FIG. 14 is a time chart showing the case where the fall of the signal level is small.

In the case where, as shown in FIG. 14, the signal level L1cyc increases above the threshold Lth and then falls and the signal level based on the variable Lrecv associated with the attenuation curve of the recovery time constant r is smaller than the signal level L1cyc over each of the periods (in the case of the period i+1), the digital signal processor 15 obtains an affirmative result in step SP6 and again updates the variable Lrecv updated in step SP16, whereby the digital signal processor 15 suppresses the signal level over the period i+1 by the gain corresponding to the signal level L1cyc of the audio data D1 over the same period and outputs the resultant audio data D1.

Accordingly, in the first preferred embodiment, only in the case where after the signal level L1cyc of the audio data D1 has risen above the threshold Lth, the signal level L1cyc lowers more sharply than the attenuation characteristic specified by the recovery time constant r, the digital signal processor 15 corrects the signal level of the audio data D1 by the gain specified by the recovery time constant r, instead of by the gain corresponding to the signal level L1cyc of the audio data D1. In addition, in this case, the digital signal processor 15 corrects the signal level of the audio data D1 by the gain corresponding to an excessively large signal level compared to the signal level L1cyc of the audio data D1, whereby it is possible to predict the occurrence of a break in sound and the like.

Figure 15:
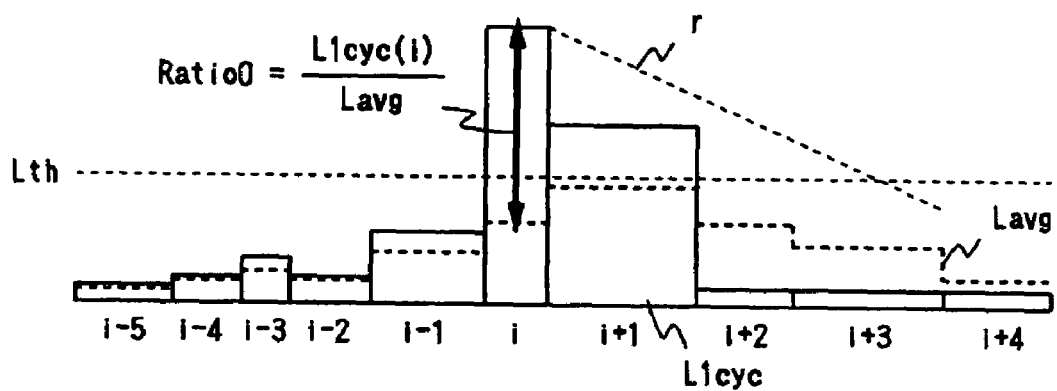
FIG. 15 is a time chart showing the relationship between signal levels over individual periods and the average value of the signal levels.
Figures 16A, 16B:
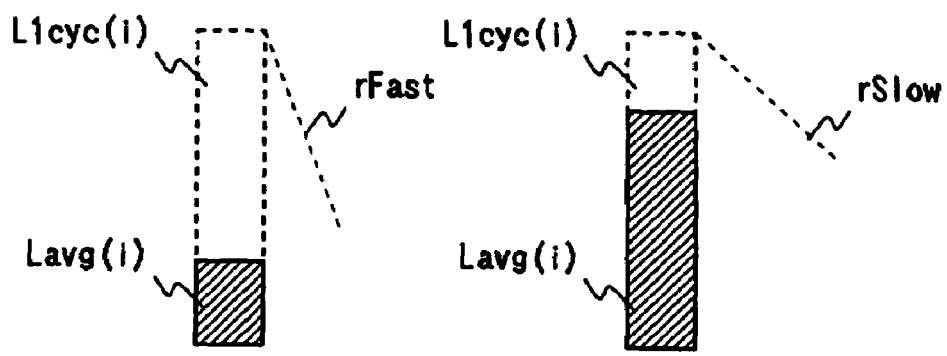
FIGS. 16A and 16B are schematic views showing the relationship between the relationship of FIG. 15 and the recovery time constants.
Figure 17:
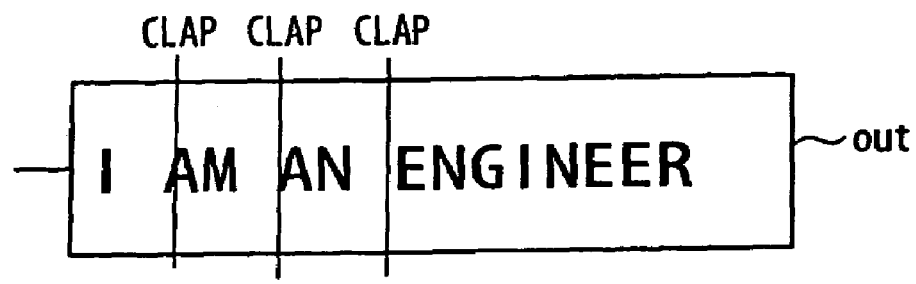
FIG. 17 is a signal waveform diagram showing the manner of reproduction of audio data.
Figure 18:
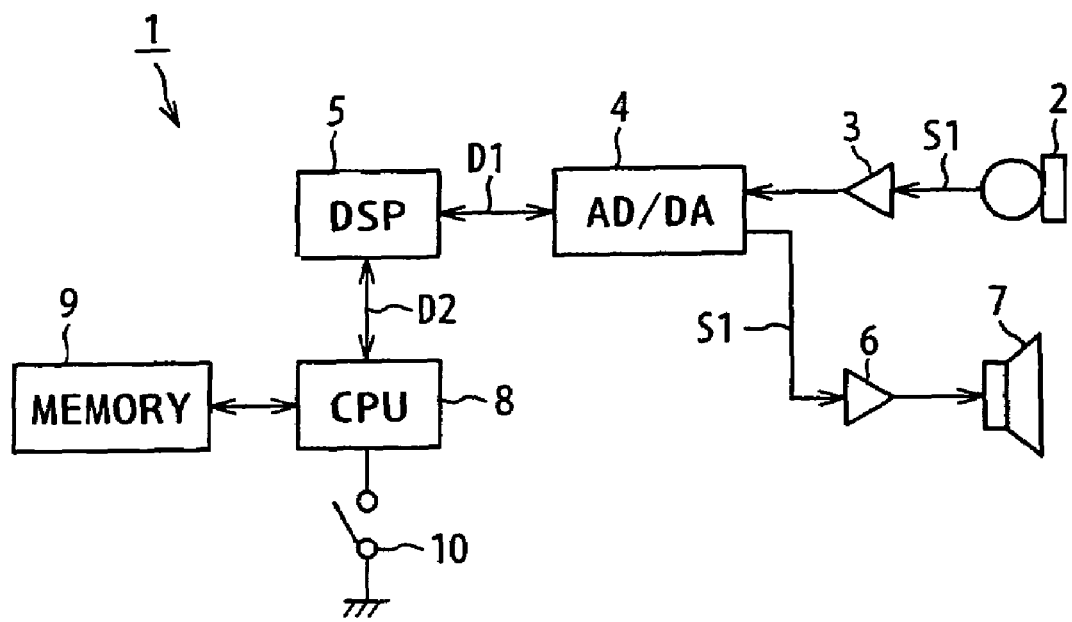
FIG. 18 is a block diagram showing a conventional IC recorder.
Figure 19:
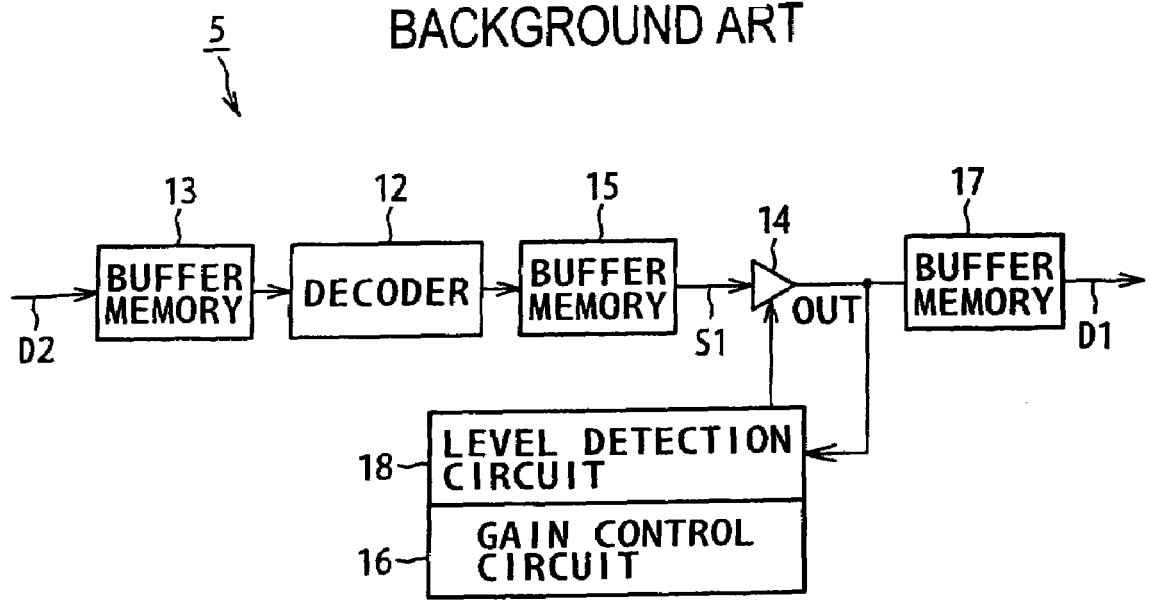
FIG. 19 is a functional block diagram showing a digital signal processor which is performing reproduction in the IC recorder of FIG. 18.
Figure 20:
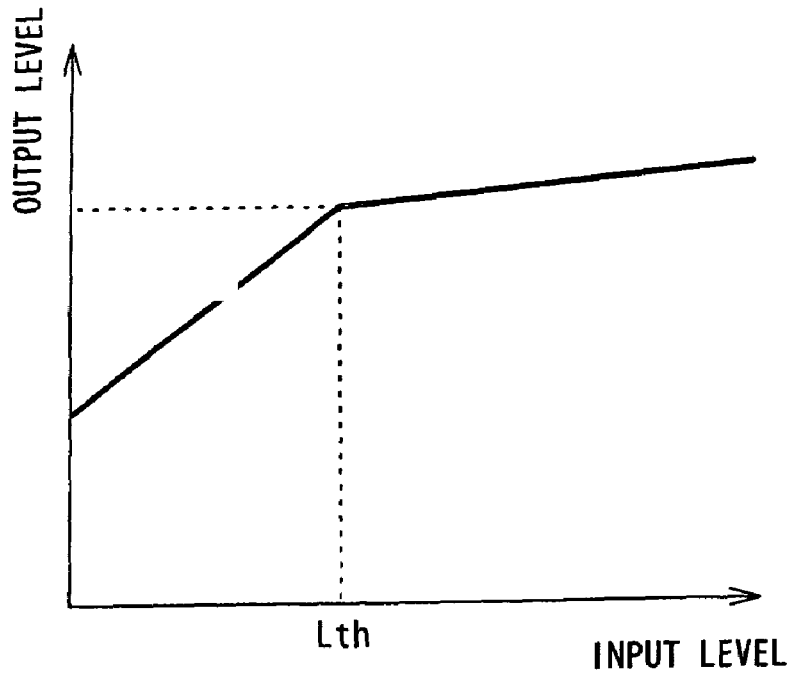
FIG. 20 is a characteristic curve diagram showing an input-output characteristic of an AGC circuit of FIG. 19.
Figure 21A:
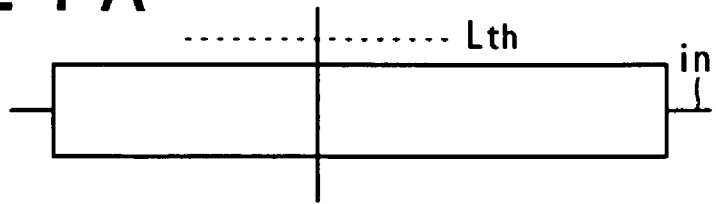
FIGS. 21A, 21B and 21C are signal waveform diagrams aiding in describing variations in a signal level due to a recovery time constant.
Figure 21B:
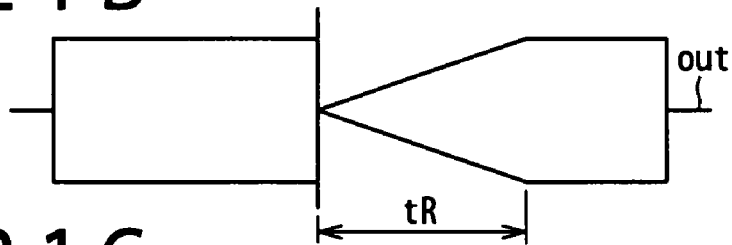
Figure 21C:
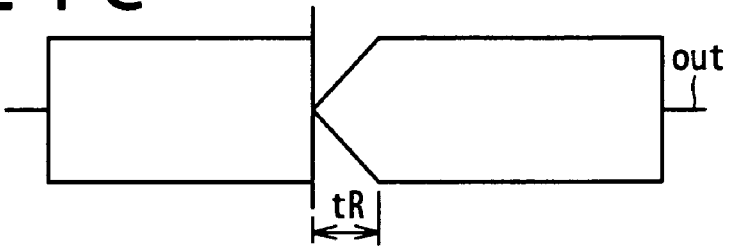
Figure 22A:
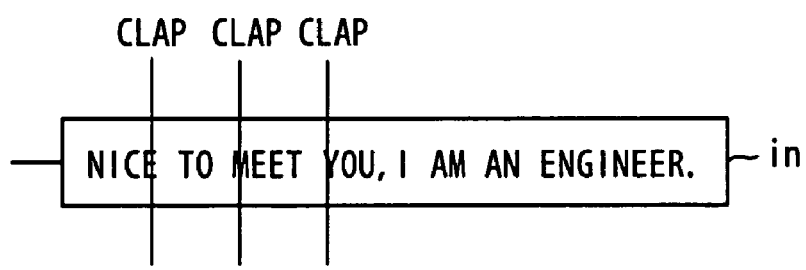
FIGS. 22A and 22B are signal waveform diagrams aiding in describing a variation in a signal level due to a long recovery time constant.
Figure 22B:
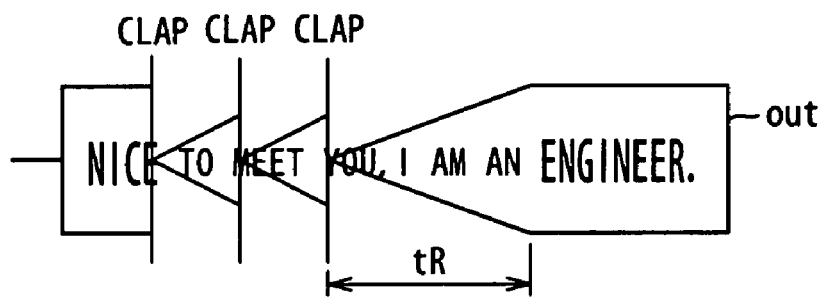
Figure 23A:
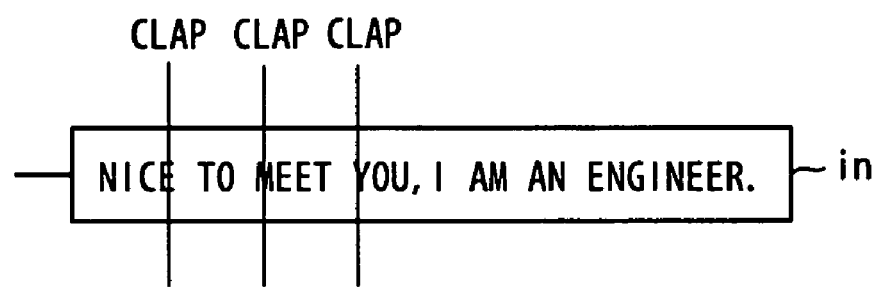
FIGS. 23A and 23B are signal waveform diagrams aiding in describing a variation in a signal level due to a short recovery time constant.
Figure 23B:
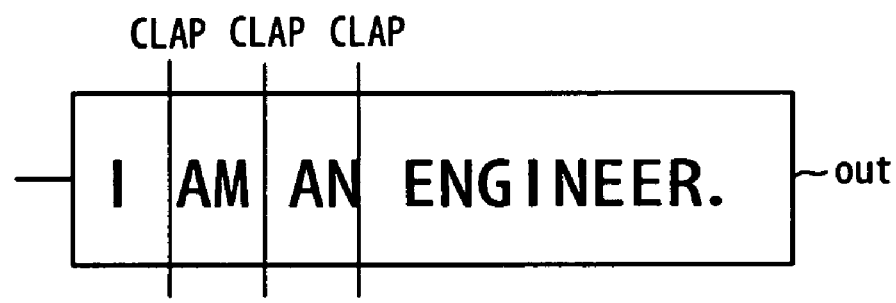

Accordingly, in the first preferred embodiment, in the case where the occurrence of a break in sound and the like can be predicted and the signal level L1cyc of the audio data D1 instantaneously increases, a value obtained by dividing the signal level L1cyc associated with the processing sequence of step SP8 by the average shift Lavg rises by the predetermined threshold Ratio0 as shown in FIG. 15, so that the digital signal processor 15 proceeds from step SP8 to step SP17 and switches the recovery time constant r to the short time constant rFast as shown in FIG. 16A. Then, the digital signal processor 15 proceeds to step SP10. Conversely, in any case other than the case where the signal level L1cyc of the audio data D1 instantaneously increases, the digital signal processor 15 obtains a negative result in step SP8 and proceeds from step SP8 to step SP9 and sets the recovery time constant r to the long time constant rSlow as shown in FIG. 16B. Then, the digital signal processor 15 proceeds to step Sp10.

Accordingly, the digital signal processor 15 suppresses the signal level of the audio data D1 by appropriately switching the recovery time constant so as to cope with the transition of the signal level of the audio data D1, thereby appropriately preventing the unnecessary suppression of the signal level and clearly reproducing the audio data D1 compared to the related art.

(2) Operation of the First Example of Preferred Embodiment

In the IC recorder 11 (FIG. 2) according to the first preferred embodiment having the above-mentioned construction, the audio signal S1 acquired by the microphone 12 is converted into the audio data D1 by the analog digital conversion circuit 14, and the audio data D1 is subjected to data compression by the processing of the digital signal processor 15 and the resultant audio data D2 is recorded on the memory 19. The audio data D2 recorded in this manner is subjected to data expansion by the digital signal processor 15, and the resultant audio data D1 is converted into the audio signal S1, which is an analog signal, by the digital/analog conversion circuit 17 and is outputted from the speaker 22.

During reproduction, after the audio data D1 processed in this manner has been subjected to data expansion by the digital signal processor 15, the signal level of the audio data D1 is corrected through similar processing executed by the AGC circuit 15BC included in the digital signal processor 15. Accordingly, in the case of a sound which is recorded in a large sound volume, the signal level of the sound is corrected into a low sound volume, and the resultant sound is outputted from the speaker 22. Accordingly, the user can listen to the sound reproduced from the IC recorder 11 without feeling a large difference in sound volume between sound from a short distance and sound from a long distance, whereby the user can use the IC recorder 11 with improved user friendliness.

In the processing of the audio data D1 by the AGC circuit 15BC in the digital signal processor 15, the audio data D1 is divided by periods on the basis of the timing when the signal level crosses zero and rises, and the signal level L1cyc is detected on the basis of a maximum amplitude value in each of the periods (FIGS. 1 and 5). In addition, the gain kx is set (FIG. 5) on the basis of the signal level L1cyc for each of the periods of the audio data D1 from records on the AGC coefficient conversion table 15C based on the input-output characteristic (FIG. 3) for suppressing large input levels, and the signal level of the audio data D1 is corrected by the gain kx.

In addition, if the signal level L1cyc which rises in a period becomes low in the succeeding period, the variable Lrecv associated with the attenuation characteristic specified by the recovery time constant r and the signal level L1cyc over the succeeding period are compared with each other on the basis of the signal level L1cyc which rises in the period, and the signal level of the audio data D1 is corrected by the gain kx which corresponds to the variable Lrecv associated with the attenuation characteristic specified by the recovery time constant r or the signal level L1cyc over the succeeding period, and the corrected audio signal is outputted. Namely, in this case, if the degree of lowering of the signal level L1cyc over the succeeding period is small, the signal level of the audio data D1 is corrected by the gain kx corresponding to the signal level L1cyc over the succeeding period, whereby the corrected audio signal is outputted.

Conversely, if the signal level L1cyc over the succeeding period rises to a great degree, the signal level of the audio data D1 is corrected by the gain kx corresponding to the variable Lrecv associated with the attenuation characteristic specified by the recovery time constant r, and the corrected audio signal is outputted. Accordingly, in the IC recorder 11, for example, even if the rise of the signal level L1cyc of the audio data D1 exceeds the threshold Lth and the signal level Lrecv specified by the recovery time constant r also exceeds the threshold Lth, the gain is decreased according to the rise of the signal level of the input signal, and after that, the gain decreased by the recovery time constant according to a sharp rise of the signal level of the input signal is gradually restored to a gain corresponding to the detected result of the signal level.

However, in the case where the gain suppressed in this manner is gradually restored, the gain is temporarily suppressed to an excessive degree with respect to the signal level L1cyc of the actual audio data D1, so that the audio data D1 reproduced from the speaker 22 becomes hard of listening to, as the result of the occurrence of breaks in sound and the like. However, if the recovery time constant r is set short in order to solve this problem, noise like snapping will be perceived during appreciation of music and the like.

Accordingly, in this IC recorder 11, the average shift Lavg of the signal level of the audio data D1 over a predetermined number of periods including the period of a target to be processed is calculated. In addition, the signal level L1cyc over the period of the target to be processed is divided by the average shift Lavg calculated in this manner, whereby the degree of the rise of a signal level over the period of the target to be processed is detected from the resultant division value.

As to the division value found in this manner, if the signal level L1cyc over the period of the target to be processed is larger than the average shift Lavg, it is possible to determine that the signal level L1cyc is small in each of the preceding and succeeding periods, but rises to a great degree in the period of the target to be processed. In this case, it is possible to determine that the signal level L1cyc rises sharply in the succeeding period. Accordingly, by setting the recovery time constant r to a short time constant, it is possible to set a short recovery time constant which enables the IC recorder 11 to follow the fall of the signal level after the rise thereof, whereby it is possible to avoid unnecessary suppression of the signal level.

Conversely, if the signal level L1cyc over the period of the target to be processed is not much larger than the average shift Lavg, it is possible to determine that the signal level L1cyc in the period of the target to be processed does not rise to a great degree with respect to the signal level L1cyc in either of the preceding and succeeding periods. In this case, it is possible to vary the gain according to the transition of the signal level of the audio data D1 by restoring the gain to a comparatively long recovery time constant without sharply restoring the decreased gain.

By switching the recovery time constant r in this manner, it is possible to switch recovery time constants according to the transition of the signal level of the audio data D1, whereby it is possible to ameliorate problems of listening to talk, music or the like compared to the related art, by preventing the signal level from being unnecessarily suppressed by a recovery time constant and by suppressing the signal level by a recovery time constant as occasion demands.

In the first preferred embodiment, since the average shift Lavg is found by approximate arithmetic processing using the weighted addition of the average shift Lavg calculated immediately previously and the signal level detection result, the arithmetic processing can be simplified.

(3) Benefit of the First Example of Preferred Embodiment

According to the above-mentioned configuration, the level of an input signal is detected in units of the period of the input signal and the recovery time constant is switched on the basis of a decision as to the signal level detection result based on the average shift of the input signal level, whereby it is possible ameliorate problems of listening to talk, music and the like.

In addition, since the average shift is found by approximate arithmetic processing using the weighted addition of the average shift calculated immediately previously and the signal level detection result, problems of listening to conversion, music and the like can be ameliorated by simple processing.

SECOND EXAMPLE OF PREFERRED EMBODIMENT

The above description of the first preferred embodiment refers to the case where the signal level of audio data is detected for each period, and an average shift is calculated in units of one period, but the present invention is not limited to this case. In other words, since gain has only to be controlled by detecting the signal level of audio data without distorting the signal waveform of the audio data, the signal level of audio data may also be detected in units of a plurality of periods such as two or more periods, and furthermore, the average shift may also be calculated in units of this plurality of periods. Otherwise, this processing may also be executed in units of a ½ period or a ¼ period.

The above description of the first preferred embodiment refers to the case where the processing of audio data is switched on the basis of two kinds of recovery time constants, but the present invention is not limited to this case and the processing may also be switched on the basis of three or more kinds of recovery time constants. In this case, any one of these recovery time constants is selected by making a decision as to a value obtained by dividing the signal level of audio data by the average value thereof, on the basis of a plurality of decision reference values corresponding to the kinds of recovery time constants.

The above description of the first preferred embodiment has referred to the case where the present invention is applied to the processing of reproducing audio data, but the present invention is not limited to this case and can also be widely applied to recording of audio data.

The above description of the first preferred embodiment refers to the case where the present invention is applied to an IC recorder, but the present invention is not limited to this case and can also be widely applied to various recording/reproducing devices which record and reproduce audio data on and from various recording media, and furthermore, to various audio devices which output audio data from line outputs. Therefore, though the present invention has been described herein in its preferred form through examples of preferred embodiments thereof with a certain degree of particularity, the present invention should not be construed as to be limited to such examples of preferred embodiments presented herein, so that various modifications, variations, combinations, sub combinations as well as different applications thereof are possible without departing from the scope and spirit of the invention.

What is claimed is:

1. An AGC circuit for varying gain according to a signal level of an input signal and correcting the signal level of the input signal, the AGC circuit comprising:
    signal level detector configured to detect the signal level of the input signal in units of a period of the input signal and outputting a result of the signal level detection; and
    gain varying circuit configured to variably control the gain for each period, based on the result of signal level detection, each period corresponding to the result of signal level detection; wherein
    the gain varying circuit:
        gradually restores gain at a recovery time constant to a gain corresponding to the result of signal level detection in response to a decrease of the signal level of the input signal, after decreasing the gain in response to a rise of the signal level of the input signal; and
        switches the recovery time constant based on the result of signal level detection, wherein the result of signal level detection is based on an average shift value of the signal level of the input signal.

2. The AGC circuit according to claim 1, wherein the average shift value comprises an approximate value calculated by weighting addition based on a previously calculated average shift value and the result of signal level detection.

3. An AGC circuit gain control method of varying gain according to a signal level of an input signal and correcting the signal level of the input signal, the AGC circuit gain control method comprising:
    detecting step of detecting the signal level of the input signal in units of a period of the input signal and outputting a result of the signal level detection; and
    gain varying step of variably controlling the gain for each period based on the result of signal level detection, each period corresponding to the result of signal level detection; wherein the gain varying step:
        gradually restores gain at a recovery time constant to a gain corresponding to the result of signal level detection in response to a decrease of the signal level of the input signal, after decreasing the gain in response to a rise of the signal level of the input signal; and
        switches the recovery time constant based on the result of signal level detection, wherein the result of signal level detection is based on an average shift value of the signal level of the input signal.

4. The AGC circuit gain control method according to claim 3, wherein the average shift value comprises an approximate value calculated by weighting addition based on a previously calculated average shift value and the result of signal level detection.

5. A program for causing a computational means to execute a processing sequence of an AGC circuit gain control method of varying gain according to a signal level of an input signal and correcting the signal level of the input signal, the AGC circuit gain control method comprising:

detecting step of detecting the signal level of the input signal in units of a period of the input signal and outputting a result of the signal level detection; and gain varying step of variably controlling the gain for each period based on the result of signal level detection, each period corresponding to the result of signal level detection; wherein the gain varying step:

gradually restores gain at a recovery time constant to a gain corresponding to the result of signal level detection in response to a decrease of the signal level of the input signal, after decreasing the gain in response to a rise of the signal level of the input signal; and switches the recovery time constant based on the result of signal level detection, wherein the result of signal level detection is based on an average shift value of the signal level of the input signal.

\* \* \* \* \*